United States Patent
Nakamura et al.

(10) Patent No.: US 7,119,554 B2
(45) Date of Patent: Oct. 10, 2006

(54) ELECTRICAL CAPACITANCE PROXIMITY SENSOR

(75) Inventors: Yasushi Nakamura, Sakura (JP); Akira Kamijima, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 11/178,383

(22) Filed: Jul. 12, 2005

(65) Prior Publication Data

US 2006/0022682 A1 Feb. 2, 2006

(30) Foreign Application Priority Data

Jul. 15, 2004 (JP) .............................. 2004-208341

(51) Int. Cl.
*G01R 27/26* (2006.01)
(52) U.S. Cl. ...................... 324/681; 324/688
(58) Field of Classification Search ............... 324/681, 324/688
See application file for complete search history.

(56) References Cited

U.S. PATENT DOCUMENTS 5,757,196 A * 5/1998 Wetzel ....................... 324/688

2003/0080755 A1 * 5/2003 Kobayashi .................. 324/658

FOREIGN PATENT DOCUMENTS

JP H07-029467 A 1/1995

* cited by examiner

*Primary Examiner*—Vincent Q. Nguyen
(74) *Attorney, Agent, or Firm*—Sughrue Mion, PLLC

(57) ABSTRACT

An electrical capacitance proximity sensor for detecting a nearby object takes a normal operation mode for detecting the nearby object approaching and a self-diagnostic mode for detecting a correct connection between a sensor section and a detecting circuit section. The detecting circuit section is provided with a buffer controller which supplies a second oscillation signal having the same phase and voltage as a first oscillation signal applied to a guard electrode in the normal operation mode, and stops supplying the second oscillation signal in the self-diagnostic mode. A control circuit determines whether the sensor section is correctly connected to the detecting circuit section base on the change in the detecting signal in the normal operation mode and the self-diagnostic mode.

6 Claims, 7 Drawing Sheets

ELECTRICAL CAPACITANCE PROXIMITY SENSOR

BACKGROUND OF THE INVENTION

1. Field of the Invention

The present invention relates to an electrical capacitance proximity sensor for detecting a nearby object in response to a variation in electrostatic capacitance and, more specifically, an electrical capacitance proximity sensor having a self-diagnostic function.

Priority is claimed from Japanese Patent Application No. 2004-208341, filed Jul. 15, 2004, the content of which is incorporated herein by reference.

2. Description of Related Art

An electrical capacitance proximity sensor for detecting a nearby object is well known in the art. Such an electrical capacitance proximity sensor converts a variation in electrostatic capacitance between a detecting electrode and a ground electrode caused by approaching the nearby object into a variation in an oscillation frequency, transforms or linearizes the oscillation frequency into a direct current voltage, and compares the direct current voltage with a predetermined threshold value to detect the nearby object. A separate structure has been proposed for the electrical capacitance proximity sensor in which a sensor section which includes the detecting electrode and the ground electrode is apart from a detecting circuit section which includes an oscillation circuit and a comparator. In this separate structure, an electrostatic capacitance is inevitably generated in a cable which connects the sensor section and the detecting circuit section and influences the variation in the electrostatic capacitance detected by the sensor section as an error, and an accurate detection of the nearby object is prevented.

To solve this problem, an electrical capacitance proximity sensor is proposed in Japanese Unexamined Patent Application, First Publication No. H07-29467 (see paragraphs 0006 through 0008 and FIG. 1). In the electrical capacitance proximity sensor, a shield electrode is interposed between the detecting electrode and the ground electrode so as to be insulated from both the detecting and ground electrode. The detecting electrode and the shield electrode are connected to a core wire and a coated wire of a shield cable, respectively. On the detecting circuit side, the core wire and the coated wire are connected to input and output terminals of a buffer circuit, respectively, in which the detecting electrode and the shield electrode are always held at the same phase and the same voltage. According to this structure, the core wire and the coated wire of the shield cable are also held at the same phase and same voltage so that no charge or discharge between the core and coated wire occurs. As a result, the above structure prevents the detecting circuit section from being influenced by the electrostatic capacitance generated in the cable.

Although the sensitivity of detection is improved in the electrical capacitance proximity sensor of the related art as described above, it does not operate well and cannot see the reason for malfunction cannot be ascertained when the sensor section and the detecting circuit section are incorrectly connected.

SUMMARY OF THE INVENTION

The present invention has been made in view of the above problems. It is therefore an object of the present invention to provide an electrical capacitance proximity sensor for detecting a nearby object with high sensitivity which has a self-diagnostic function to determine whether a sensor section is correctly connected to a detecting circuit section. To achieve the above object, an electrical capacitance proximity sensor for detecting a nearby object according to a first aspect of the present invention has: a sensor section which includes a first electrode used as a detecting electrode, a second electrode used as other than the detecting electrode, and a guard electrode provided between the first and second electrodes, the guard electrode being insulated from the first and second electrodes; a detecting circuit section which detects the nearby object by monitoring a variation in an electrostatic capacitance generated by the first electrode to output a detecting signal; a connecting cable which includes first and second wires to connect the sensor section and the detecting circuit section, wherein: the first electrode and the guard electrode are connected to one end of the first and second wires, respectively; the detecting circuit section receives a first oscillation signal according to the electrostatic capacitance generated by the first electrode from the other end of the first wire and supplies a second oscillation signal having the same phase and the same voltage as the first oscillation signal to the other end of the second wire, the detecting circuit section taking a normal operation mode for detecting the nearby object and self-diagnostic mode for making a diagnostic of a correct connection between the sensor section and the detecting circuit section; and the detecting circuit section further includes: a switching controller which supplies the second oscillation signal to the other end of the second wire in the normal operation mode and stops supplying the second oscillation signal to the other end of the second wire in the self-diagnostic mode; and a control circuit which determines an incorrect connection between the sensor section and the detecting circuit section in the self-diagnostic mode based on changes in the detecting signal by comparing the detecting signal in the normal operation mode with the detecting signal in the self-diagnostic mode.

Further, an electrical capacitance proximity sensor for detecting a nearby object according to a second aspect of the present invention has: a sensor section which includes a first electrode used as a detecting electrode, a second electrode used as other than the detecting electrode, and a guard electrode provided between the first and second electrodes, the guard electrode being insulated from the first and second electrodes; a detecting circuit section which detects the nearby object by monitoring a variation in an electrostatic capacitance generated by the first electrode to output a detecting signal; a connecting cable which includes first and second wires to connect the sensor section and the detecting circuit section, wherein: the first electrode and the guard electrode are connected to one end of the first and second wires, respectively; the detecting circuit section receives a first oscillation signal according to the electrostatic capacitance generated by the first electrode from the other end of the first wire and supplies a second oscillation signal having the same phase and the same voltage as the first oscillation signal to the other end of the second wire, the detecting circuit section taking a normal operation mode for detecting the nearby object and self-diagnostic mode for making a diagnostic of a correct connection between the sensor section and the detecting circuit section; and the detecting circuit section further includes: a voltage pattern applying circuit which supplies a predetermined voltage pattern, instead of the second oscillation signal, to the other end of the second wire in the self-diagnostic mode; and a control circuit which determines an incorrect connection between the sensor section and the detecting circuit section in the self-diagnostic mode based on changes in the detecting signal when the predetermined voltage pattern is supplied to the other end of the second wire.

DETAILED DESCRIPTION OF THE INVENTION

Now, exemplary embodiments of the present invention will be described below with reference to the drawings.

Figure 1:
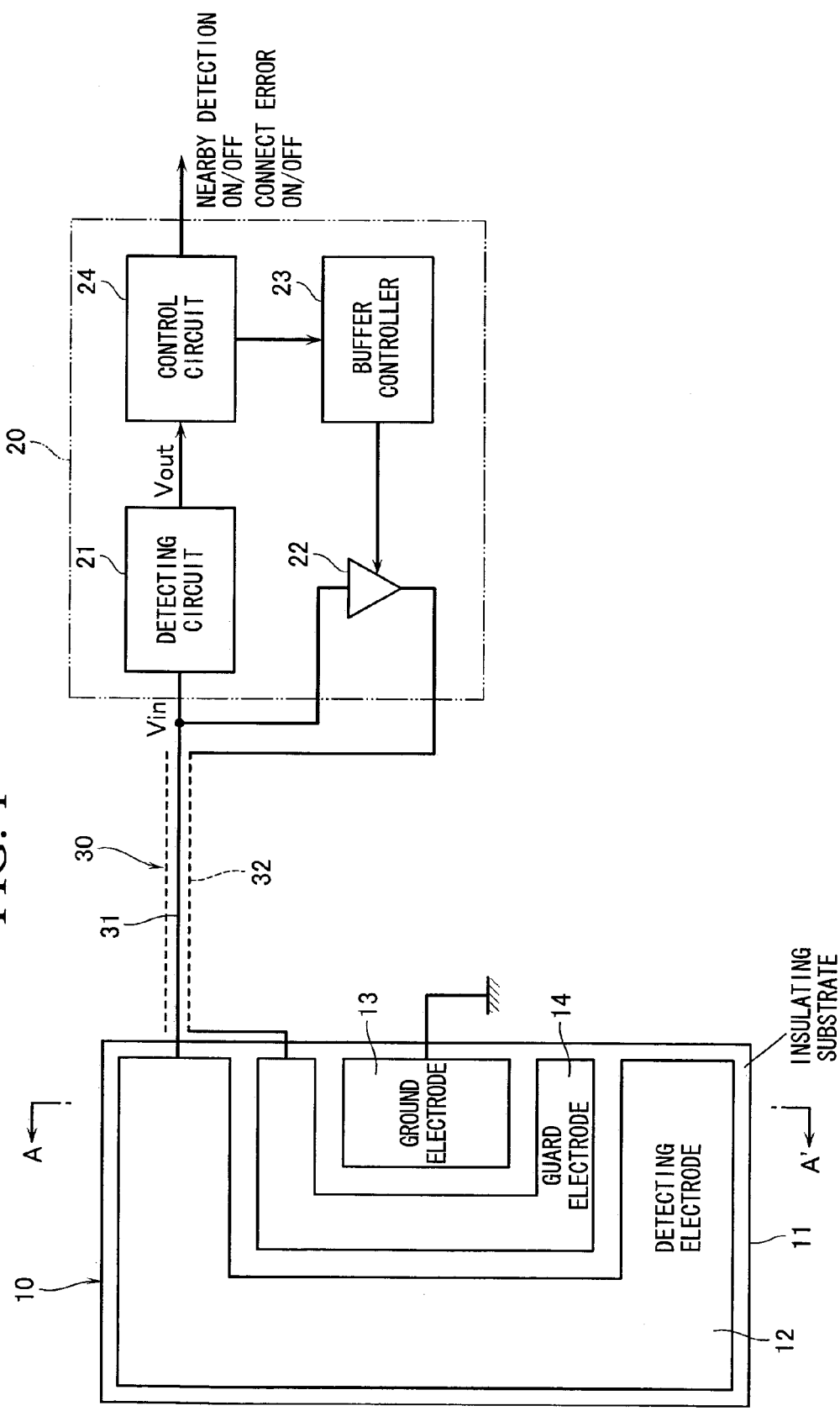
FIG. 1 is a block diagram showing an electrical capacitance proximity sensor and a detecting circuit section for the electrical capacitance proximity sensor according to a first exemplary embodiment of the present invention.

FIG. 1 shows an electrical capacitance proximity sensor for detecting a nearby object according to a first exemplary embodiment of the present invention.

The electrical capacitance proximity sensor system includes a sensor section 10, a detecting circuit section 20 and a shield cable 30 for connecting the sensor section 10 and the detecting circuit section 20.

Figure 2:
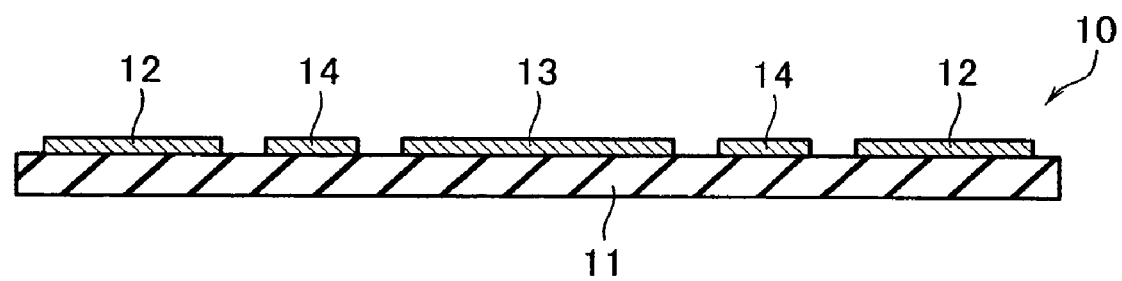
FIG. 2 is a cross-sectional view taken along a line A–A' in FIG. 1 showing the electrical capacitance proximity sensor according to the first exemplary embodiment of the present invention.

The sensor section 10 is formed by a flexible print circuit (FPC), a rigid print circuit (RPC) or the like. As shown in FIG. 2 which is a cross-sectional view taken along a line A–A' in FIG. 1, the sensor section 10 includes an insulating substrate 11 made of polyethylene terephthalate (PET), polyethylene naphthalete (PEN), epoxy resin, or the like. A detecting electrode 12, which may also be referred to as a "first electrode" and is made of copper, copper alloy, aluminum, or the like, is formed by a pattern printing on the insulating substrate 11. The sensor section 10 is also provided with a ground or earth electrode 13, which may also be referred to as a "second electrode", and a guard electrode 14. The ground electrode 13 is square or rectangular in shape. The guard electrode 14 has a U-shaped configuration to surround three sides of the ground electrode 13. The detecting electrode 12 also has a U-shaped configuration to surround the outer periphery of the guard electrode 14. The detecting, ground and guard electrodes 12, 13 and 14 are insulated from each other.

The detecting circuit section 20 includes a detecting circuit 21, a buffer 22, a buffer controller 23 and a control circuit 24. The detecting circuit 21 receives an input signal Vin (this signal may be also referred to as a "first oscillation signal") from the detecting electrode 12 and outputs a detecting signal Vout corresponding to an amount of an electrostatic capacitance generated between the detecting electrode 12 and the ground electrode 13. The buffer 22 receives the input signal Vin and outputs a second oscillation signal which has the same phase and the same voltage as the input signal Vin to the guard electrode 14. That is, the buffer 22 functions as a voltage follower whose gain is "1". The buffer controller 23 controls the activation of the buffer 22 and makes the buffer 22 turn on or off. The control circuit 24 receives the detecting signal Vout from the detecting circuit 21 to output a nearby detection signal and a connect error signal as described later and controls the buffer controller 23.

The shield cable 30 consists of a core wire 31 (which may also be referred to as a "first line") and a coated wire 32 (which may also be referred to as a "second line") surrounding the core wire 31 with an insulation material coated therebetween. One end of the core wire 31 is connected to the detecting electrode 12 while the other end is connected to an input terminal of the detecting circuit 21. One end of the core wire 32 is connected to the guard electrode 14 while the other end is connected to an output terminal of the buffer 22.

The detecting circuit 21 will now be described in detail with reference to FIG. 3.

As the detecting circuit 21, a circuit can be used such that its frequency or duty ratio is changed in accordance with the amount of the electrostatic capacitance generated between the detecting electrode 12 and the ground electrode 13. FIG. 3 shows one example of the detecting circuit 21 whose duty ratio is changed in response to variation in the electrostatic capacitance C.

Figure 3:
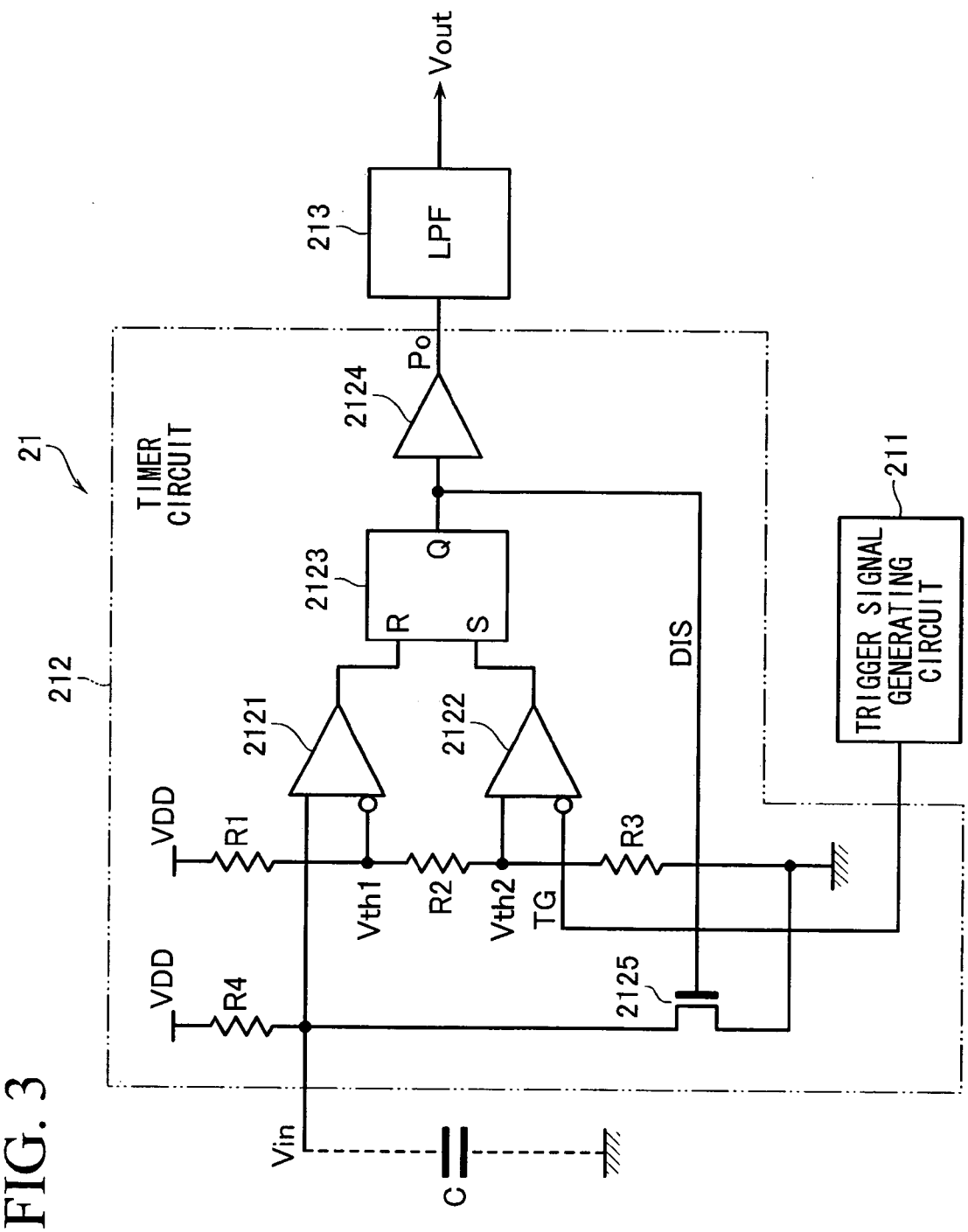
FIG. 3 is a circuit diagram showing a detecting circuit in the detecting circuit section shown in FIG. 1 according to the first exemplary embodiment of the present invention.

As shown in FIG. 3, the detecting circuit 21 includes a trigger signal generating circuit 211, a timer circuit 212 and a low pass filter (LPF) 213. The trigger signal generating circuit 211 generates a trigger signal whose frequency is constant. The timer circuit 212 generates a pulse signal Po whose duty ratio is changed in accordance with an electrostatic capacitance C connected to its input terminal. The LPF 213 passes a direct current component of the pulse signal Po output from the timer circuit 212 and outputs it as the detecting signal Vout.

In this exemplary embodiment, the timer circuit 212 is formed by a pair of comparators 2121 and 2122, an RS flip-flop (RS-FF) 2123 which receives outputs of the comparators 2121 and 2122 to its R and S terminals, respectively, a buffer 2124 which receives an output DIS of the RS-FF 2123 and outputs it to the LPF 213, and a transistor 2125 which is controlled to turn on or off by the output DIS of the RS-FF 2123.

Figure 4:
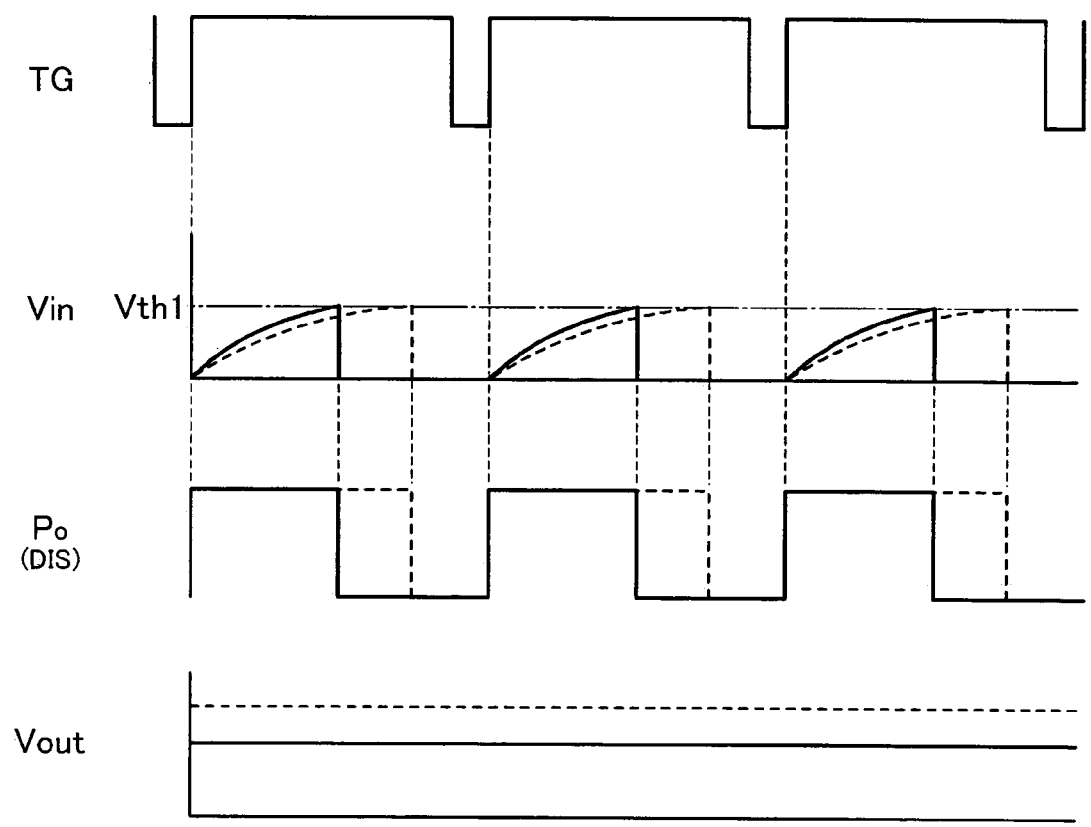
FIG. 4 is a time chart showing an operation of the detecting circuit shown in FIG. 3 in a normal operation mode according to the first exemplary embodiment of the present invention.

As shown in FIG. 3, the comparator 2122 compares the trigger signal TG generated by the trigger signal generating circuit 211 with a predetermined threshold value Vth2 which is generated by dividing a source voltage VDD by resistors R1, R2 and R3. As a result of the comparison, the comparator 2122 produces set pulses whose frequency is synchronized with the trigger signal TG The set pulses set the Q output of the RS-FF 2123. The Q output makes, functioning as the discharge signal DIS, the transistor 2125 turn off. In this state, the capacitor defined between the detecting electrode 12 and the ground electrode 13 is charged by the source voltage VDD at a charging velocity determined by a time constant according to the capacitance C between the detecting and the ground electrodes 12 and 13 and the resistance of the resistor R4 connected between the input terminal and the source voltage VDD. Thus, as shown in FIG. 4, the voltage of the input signal Vin is increased at the charging velocity determined by the amount of the electrostatic capacitance.

When the input signal Vin exceeds a threshold value Vth1 which is determined by the resistors R1, R2 and R3, the output of the comparator 2121 is reversed to reset the RS-FF 2123 and to reverse the Q output (DIS). The transistor 2125 is then turned on so as to make the detecting electrode 12 discharge the electric charge stored therein through the transistor 2125. Thus, the timer circuit 212 outputs the pulse signal Po which is oscillating with the duty ratio determined by the electrostatic capacitance formed between the detecting electrode 12 and the ground electrode 13 as shown in FIG. 4. The LPF 213 smoothes the pulse signal Po and outputs the detecting signal Vout having a direct current voltage as shown in FIG. 4. When the electrostatic capacitance is relatively small, the waveforms of the input signal Vin, the pulse signal Po and the detecting signal Vout are represented by solid lines in FIG. 4. When the electrostatic capacitance is increased by, for instance, approaching an object to be detected, the waveforms of the input signal Vin, the pulse signal Po and the detecting signal Vout become dotted lines as represented in FIG. 4.

The control circuit 24 takes a normal operation mode or a self-diagnostic mode. In the normal operation mode, the control circuit 24 enables the buffer 22 to be in the on state through the buffer controller 23 and monitors the detecting signal Vout output from the detecting circuit 21. In the self-diagnostic mode, the control circuit 24 makes the buffer 22 be in an off state and monitors the change in the detecting signal Vout to determine whether or not the sensor section 10 is correctly connected to the detecting circuit section 20.

Figure 5:
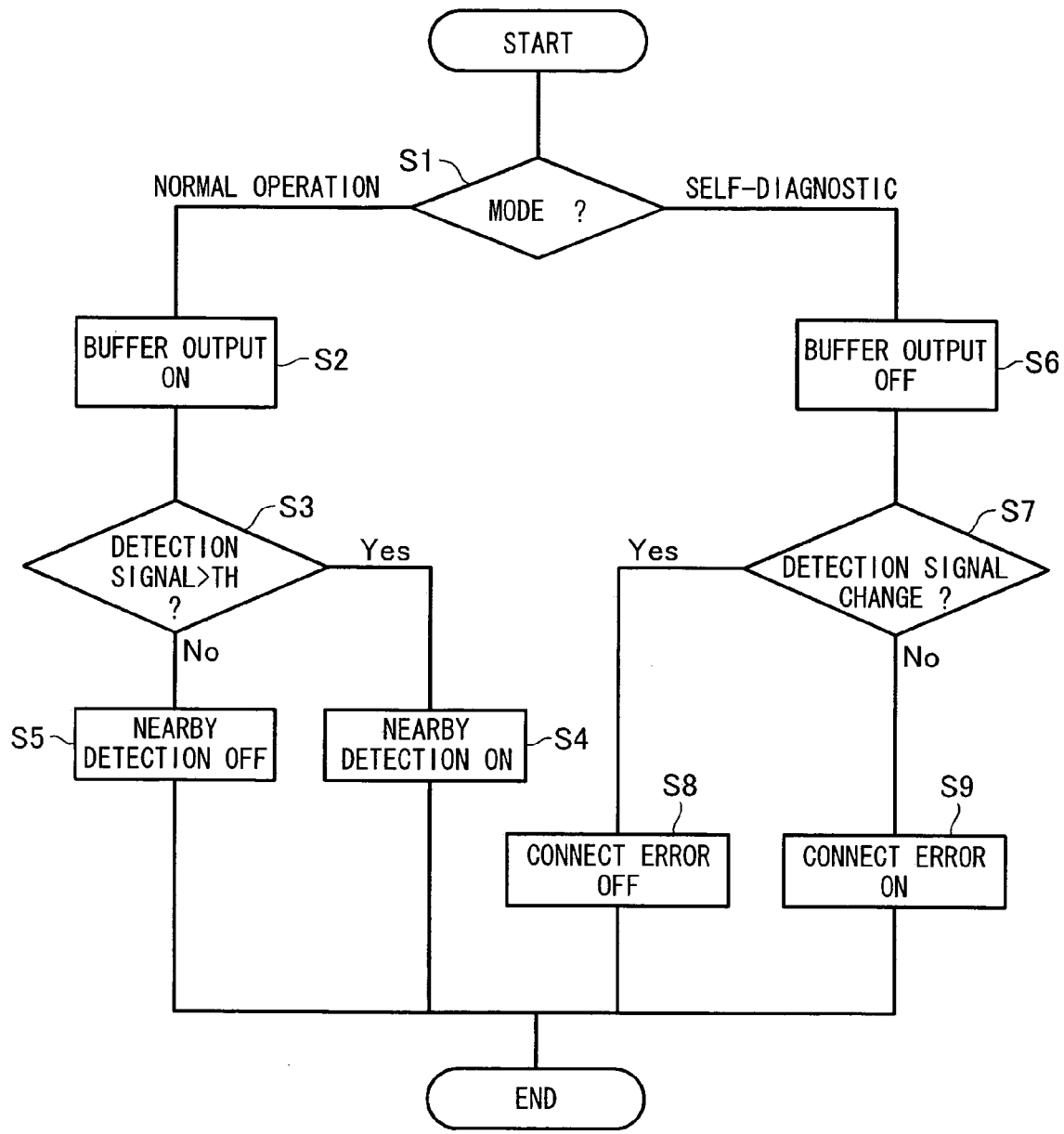
FIG. 5 is a flow chart showing an operation of a control circuit in the detecting circuit section shown in FIG. 1 according to the first exemplary embodiment of the present invention.

Next, the operation of the electrical capacitance proximity sensor thus structured will be explained. FIG. 5 shows the operation of the control circuit 24.

First, the operator or a superior device sets the detecting circuit section 20 to be in the normal operation mode or the self-diagnostic mode.

When the normal operation mode is requested (SI), the control circuit 24 makes the buffer 22 be in the on state (S2) via the buffer controller 23 and monitors the detecting signal Vout from the detecting circuit 21 (S3). When the buffer 22 is activated, the second oscillation signal, which has the same phase and voltage as the input signal Vin appearing in the core wire 31, is applied to the coated wire 32 of the shield cable 30. Accordingly, the input signal Vin to the detecting circuit 21 is not influenced by the electrostatic capacitance existing between the core wire 31 and the coated wire 32. Thus, the electrostatic capacitance detected by the detecting circuit 21 depends only on the electrostatic capacitance between the detecting electrode 12 and the ground electrode 13 and that between the nearby object to be detected and the detecting electrode 12. This structure makes it possible to increase the sensitivity in the detection of the nearby object.

When the detecting signal Vout exceeds a predetermined threshold value TH, the control circuit 24 determines that the object is approaching to the detecting electrode 12 and turns the nearby detection signal on (S4). Otherwise, it holds the nearby detection signal off (S5). In this exemplary embodiment, the nearby detection signal has only two values, i.e., on and off. It is possible, however, that the nearby detection signal has more than two levels each of which represents a distance between the nearby object and the detecting electrode 12 when the kind of object is generally specified in advance.

When the self-diagnostic mode is requested (S1), the control circuit 24 makes the buffer 22 be in the off state (S6) via the buffer controller 23. When the buffer 22 is not activated, the coated wire 32 of the shield cable 30 is in the floating state so as to increase the capacity coupling between the detecting electrode 12 and the ground electrode 13. In the case in which the sensor section 10 and the detecting circuit section 20 are correctly connected, the electrostatic capacitance in the input signal Vin of the detecting circuit 21 suddenly varies and the detecting signal Vout also suddenly changes. On the other hand, in the case in which the sensor section 10 and the detecting circuit section 20 are incorrectly connected, the input terminal of the detecting circuit 21 is in an open state. Any substantial variation in electrostatic capacitance does not appear in the input signal Vin in the normal and the self-diagnostic operation modes. The detecting signal Vout is, therefore, not changed no matter when the buffer 22 is in the on state or off state. That is, the detecting signal Vout is maintained to keep substantially constant value even if the buffer 22 is turned from on to off. The control circuit 24 monitors the change in the input signal Vin (S7) before and after the buffer 22 is turned from on to off. If there is a substantial change in the input signal Vin, the control circuit 24 holds to make the connect error signal off (S8). If there is not a substantial change in the input signal Vin, the control circuit 24 makes the connect error signal on (S9) and outputs it to indicate the misconnection.

As described above, the electrical capacitance proximity sensor according to the present exemplary embodiment can determine whether the sensor section 10 is correctly connected to the detecting circuit section 20 by effectively utilizing the guard electrode 14 which is provided for increasing the sensitivity of the nearby object detecting sensor without providing an additional electrode on the sensor section for detecting the misconnection.

Next, an electrical capacitance proximity sensor according to a second exemplary embodiment of the present invention will be described with reference to FIG. 6. In the drawing, structural elements similar to or the same as the first exemplary embodiment bear the same reference numerals and explanations thereof are omitted.

Figure 6:
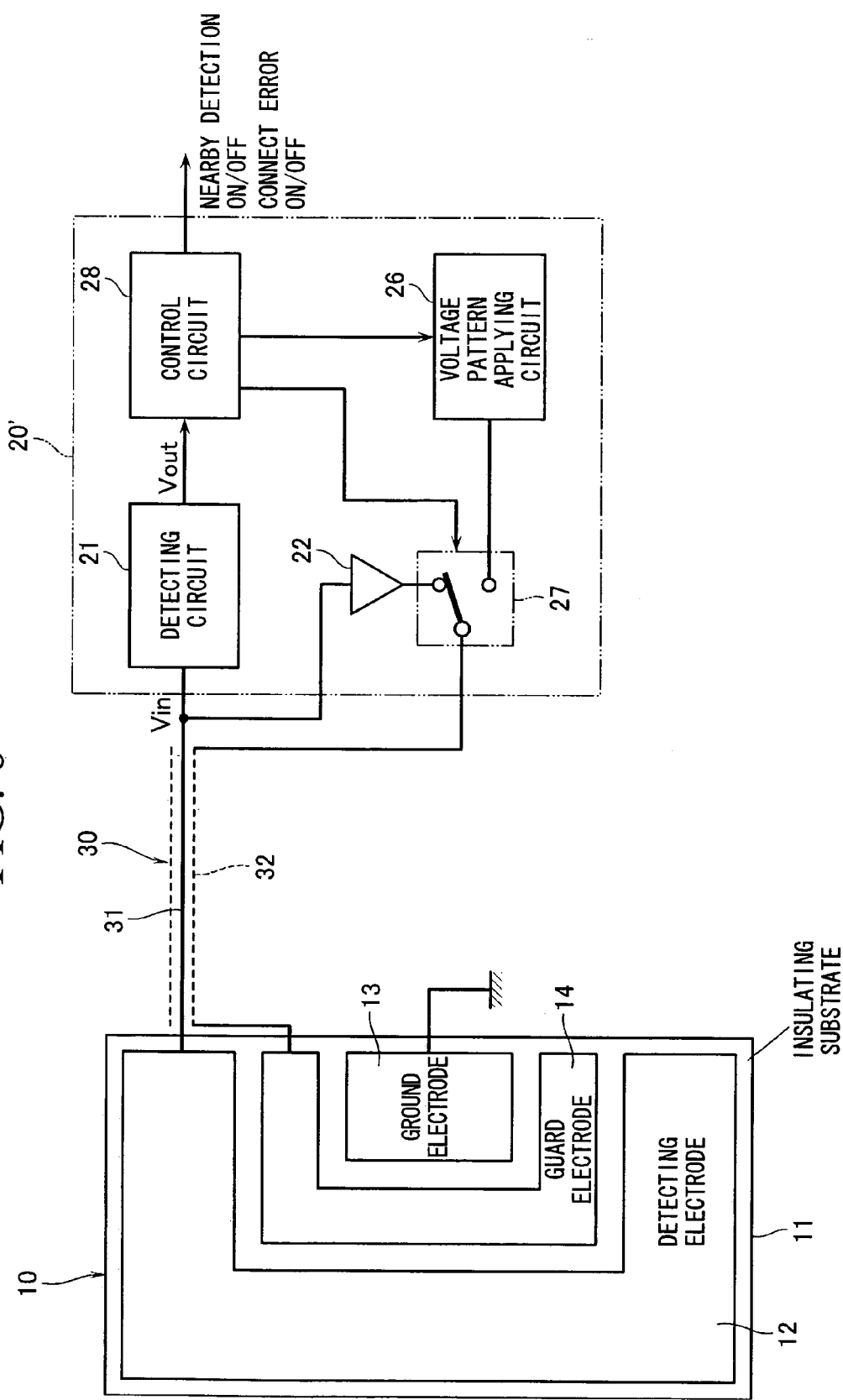
FIG. 6 is a block diagram showing an electrical capacitance proximity sensor and a detecting circuit section for the electrical capacitance proximity sensor according to a second exemplary embodiment of the present invention.

As shown in FIG. 6, the difference between the first and second exemplary embodiments is a structure of the detecting circuit section 20'. In the second exemplary embodiment, the detecting circuit section 20' has a voltage pattern applying circuit 26 which generates a predetermined voltage pattern for self-diagnosis. A control circuit 28 controls a switch 27 and the voltage pattern applying circuit 26 such that one of the output of the buffer 22, which outputs the signal of the same phase and voltage as the input signal Vin, and the voltage pattern generated by the voltage pattern applying circuit 26 is applied to the core wire 32 through the switch 27. The control circuit 28 causes the output terminal of the switch 27 to connect to the output of the buffer 22 in a normal operation mode while it causes the output terminal of the switch 27 to connect to the output of the voltage pattern applying circuit 26 in a self-diagnostic mode.

Figure 7:
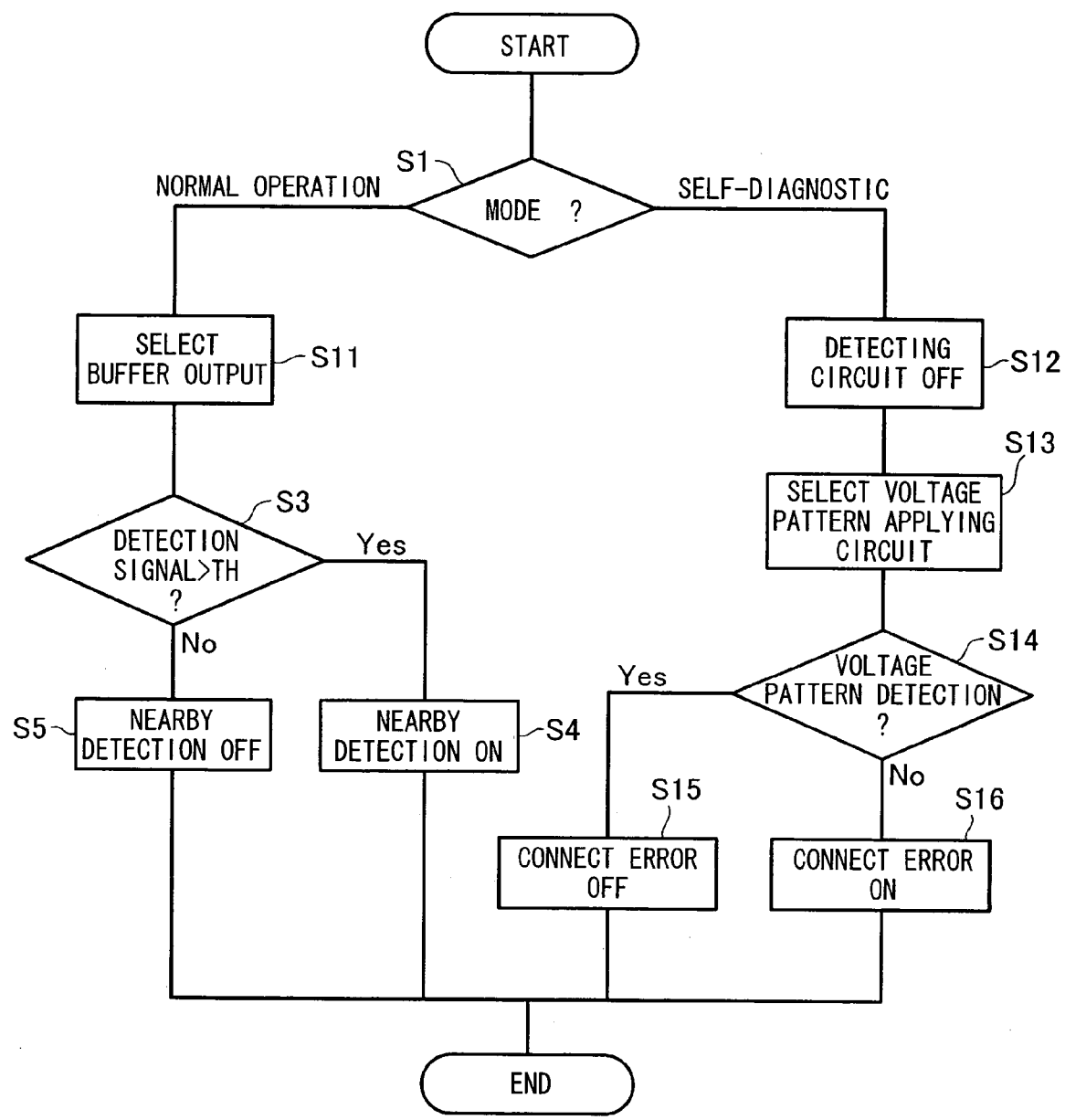
FIG. 7 is a flow chart showing an operation of a control circuit in a detecting circuit section shown in FIG. 6 according to the second exemplary embodiment of the present invention.

The operation of the detecting circuit section 20' will now be described with reference to FIG. 7.

In the same manner as in the first exemplary embodiment, the operator or the superior device sets the detecting circuit section 20' to be in the normal operation mode or the self-diagnostic mode.

When the normal operation mode is requested (S1), the control circuit 28 causes the switch 27 to connect to the output terminal of the buffer 22 (S11). Thereafter, the control circuit 28 monitors the detecting signal Vout generated by the detecting circuit 21 and outputs the nearby detection signal in the same manner as explained in the first exemplary embodiment with reference to FIG. 5 and, therefore, the explanation is omitted.

When the self-diagnostics mode is requested (S1), the control circuit 28 makes the detecting circuit 21 inactive (S12) and causes the switch 27 to connect to the output terminal of the voltage pattern applying circuit 26 (S13). In this state, the control circuit 28 monitors the input signal Vin. In the case in which the sensor section 10 is correctly connected to the detecting circuit section 20', the voltage pattern generated by the voltage pattern applying circuit 26 is observed in the input signal Vin which is generated through the electrostatic capacitance between the detecting electrode 12 and the guard electrode 14 and that between the core wire 30 and the coated wire 32 of the shield cable 30. On the other hand, unless the sensor section 10 is correctly connected to the detecting circuit section 20', the voltage pattern applied to the voltage pattern applying circuit 26 is not observed in the input signal Vin. In this manner, the control circuit 28 monitors the input signal Vin to the input terminal of the detecting circuit 21 (S14), holds the connect error signal to be off when detecting the applied voltage pattern (S15) and makes the connect error signal on when not detecting the applied voltage pattern (S16).

Also in the second exemplary embodiment, the self-diagnosis of the sensor section 10 can be achieved by effectively utilizing the guard electrode 14 similar to in the first embodiment.

In the first and second exemplary embodiments, while the ground electrode 13 is used as the second electrode, another electrode except for the detecting electrode on the substrate 11 can be used as the second electrode. Furthermore, while the shield cable 30 is used for connecting the sensor section 10 and the detecting circuit section 20 or 20' in the first and second exemplary embodiments, other configuration of cables such as an FPC, FFC and parallel cable can also be used therefor.

As described above, the electrical capacitance proximity sensor according to exemplary embodiments of the present invention can determine whether or not the sensor section is correctly connected to the detecting circuit section by effectively utilizing the guard electrode which is originally provided for increasing the sensitivity of the electrical capacitance proximity sensor without providing an additional, special electrode for detecting the misconnection.

While exemplary embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An electrical capacitance proximity sensor for detecting a nearby object, comprising:
   a sensor section which includes a first electrode used as a detecting electrode, a second electrode used as other than said detecting electrode, and a guard electrode provided between said first and second electrodes, said guard electrode being insulated from said first and second electrodes;
   a detecting circuit section which detects said nearby object by monitoring a variation in an electrostatic capacitance generated by said first electrode to output a detecting signal;
   a connecting cable which includes first and second wires to couple said sensor section to said detecting circuit section, wherein:
   said first electrode and said guard electrode are coupled to one end of said first and second wires, respectively;
   said detecting circuit section receives a first oscillation signal according to said electrostatic capacitance generated by said first electrode from the other end of said first wire and supplies a second oscillation signal having the same phase and the same voltage as said first oscillation signal to the other end of said second wire, said detecting circuit section taking a normal operation mode for detecting said nearby object and taking a self-diagnostic mode for making a diagnostic of a correct connection between said sensor section and said detecting circuit section, and
   wherein said detecting circuit section further includes:
   a switching controller which supplies said second oscillation signal to said other end of said second wire in said normal operation mode and stops supplying said second oscillation signal to said other end of said second wire in said self-diagnostic mode; and
   a control circuit which detects an incorrect connection between said sensor section and said detecting circuit section in said self-diagnostic mode based on changes in said detecting signal by comparing said detecting signal in said normal operation mode with said detecting signal in said self-diagnostic mode.

2. The electrical capacitance proximity sensor as recited in claim 1, wherein said detecting circuit section further includes:
   a voltage pattern applying circuit which supplies a predetermined voltage pattern, instead of said second oscillation signal, to said other end of said second wire in said self-diagnostic mode; and
   a control circuit which determines an incorrect connection between said sensor section and said detecting circuit section in said self-diagnostic mode based on changes in said detecting signal when said predetermined voltage pattern is supplied to said other end of said second wire.

3. A method for operating an electrical capacitance proximity sensor which has a sensor section including a detecting electrode and a guard electrode coupled to a fist signal line and a second signal line, respectively, said method comprising:
   receiving a first oscillation signal from said detecting electrode through said first signal line;
   detecting a nearby object approaching said detecting electrode according to a variation in electrostatic capacitance in said first oscillation signal generated by said detecting electrode;
   supplying a second oscillation signal having the same phase and voltage as said first oscillation signal to said guard electrode through said second signal line in a normal operation mode;
   ceasing supplying said second oscillation signal to said guard electrode through said second signal line in a self-diagnostic mode;

monitoring an input signal from said detecting electrode to detect a substantial change in said electrostatic capacitance before and after said ceasing supplying said second oscillation signal; and determining an incorrect connection of said sensor section when said substantial change is detected.

4. A method for operating an electrical capacitance proximity sensor as recited in claim 3, further comprising supplying a predetermined voltage pattern to said guard electrode through said second signal line after said ceasing supplying said second oscillation signal, wherein said monitoring said input signal includes detection of a change in said input signal corresponding to said predetermined voltage pattern.

5. A method for operating an electrical capacitance proximity sensor as recited in claim 3, wherein said detecting said nearby object includes converting an amount of said electrostatic capacitance into a pulse signal having a duty ratio corresponding to said amount of said electrostatic capacitance generated by said detecting electrode.

6. An electrical capacitance proximity sensor for detecting a nearby object, comprising:
- a sensor section which includes a first electrode used as a detecting electrode, a second electrode used as other than said detecting electrode, and a guard electrode provided between said first and second electrodes, said guard electrode being insulated from said first and second electrodes;
- a detecting circuit section which detects said nearby object by monitoring a variation in an electrostatic capacitance generated by said first electrode to output a detecting signal;
- a connecting cable which includes first and second wires to couple said sensor section to said detecting circuit section, wherein:

said first electrode and said guard electrode are coupled to one end of said first and second wires, respectively;

said detecting circuit section receives a first oscillation signal according to said electrostatic capacitance generated by said first electrode from the other end of said first wire and supplies a second oscillation signal having the same phase and the same voltage as said first oscillation signal to the other end of said second wire, said detecting circuit section taking a normal operation mode for detecting said nearby object and taking a self-diagnostic mode for making a diagnostic of a correct connection between said sensor section and said detecting circuit section, and wherein said detecting circuit section further includes:

a voltage pattern applying circuit which supplies a predetermined voltage pattern, instead of said second oscillation signal, to said other end of said second wire in said self-diagnostic mode; and a control circuit which determines an incorrect connection between said sensor section and said detecting circuit section in said self-diagnostic mode based on changes in said detecting signal when said predetermined voltage pattern is supplied to said other end of said second wire.

* * * * *